United States Patent
Cho et al.

(10) Patent No.: US 8,264,091 B2
(45) Date of Patent: Sep. 11, 2012

(54) INTEGRATED CIRCUIT PACKAGING SYSTEM WITH ENCAPSULATED VIA AND METHOD OF MANUFACTURE THEREOF

(75) Inventors: NamJu Cho, Uiwang-si (KR); HeeJo Chi, Ichon si (KR); HanGil Shin, Seongnam-si (KR)

(73) Assignee: Stats Chippac Ltd., Singapore (SG)

( * ) Notice: Subject to any disclaimer, the term of this patent is extended or adjusted under 35 U.S.C. 154(b) by 430 days.

(21) Appl. No.: 12/563,514

(22) Filed: Sep. 21, 2009

(65) Prior Publication Data

US 2011/0068453 A1    Mar. 24, 2011

(51) Int. Cl.
*H01L 23/28* (2006.01)
*H01L 21/44* (2006.01)

(52) U.S. Cl. ........ 257/787; 257/774; 257/737; 257/780; 257/E23.021; 257/E21.502; 438/126; 438/127

(58) Field of Classification Search ............... 257/774, 257/780, 737, E23.021, 787, E3.021, E21.502; 438/126, 127
See application file for complete search history.

(56) References Cited

U.S. PATENT DOCUMENTS

| | | | |
|---|---|---|---|
| 5,437,763 A | 8/1995 | Huang | |
| 5,726,493 A * | 3/1998 | Yamashita et al. | 257/698 |
| 5,824,599 A | 10/1998 | Schacham-Diamand et al. | |
| 6,054,378 A | 4/2000 | Skala et al. | |
| 6,444,565 B1 | 9/2002 | Feild et al. | |
| 6,489,676 B2 | 12/2002 | Taniguchi et al. | |
| 6,498,676 B1 * | 12/2002 | Zimmerman et al. | 359/337.1 |
| 7,034,386 B2 * | 4/2006 | Kurita | 257/685 |
| 7,185,420 B2 * | 3/2007 | Mayer | 29/739 |
| 7,185,426 B1 | 3/2007 | Hiner et al. | |
| 7,345,361 B2 | 3/2008 | Mallik et al. | |
| 7,678,384 B2 | 3/2010 | Chou et al. | |
| 7,714,453 B2 * | 5/2010 | Khan et al. | 257/787 |
| 2002/0135057 A1 * | 9/2002 | Kurita | 257/685 |
| 2002/0175399 A1 * | 11/2002 | James et al. | 257/683 |
| 2008/0073769 A1 | 3/2008 | Wu et al. | |
| 2009/0140408 A1 | 6/2009 | Lee et al. | |
| 2009/0236752 A1 * | 9/2009 | Lee et al. | 257/777 |
| 2009/0315164 A1 | 12/2009 | Chow et al. | |
| 2010/0171205 A1 * | 7/2010 | Chen et al. | 257/686 |
| 2010/0171207 A1 | 7/2010 | Shen et al. | |
| 2011/0260334 A1 * | 10/2011 | Hasegawa | 257/774 |

* cited by examiner

*Primary Examiner* — Nitin Parekh
(74) *Attorney, Agent, or Firm* — Ishimaru & Associates LLP; Mikio Ishimaru; Stanley M. Chang (57) ABSTRACT

A method of manufacture of an integrated circuit packaging system includes: providing a substrate; mounting an integrated circuit over the substrate; attaching a buffer interconnect to and over the substrate; forming an encapsulation over the substrate covering the buffer interconnect and the integrated circuit; and forming a via in the encapsulation and to the buffer interconnect.

20 Claims, 5 Drawing Sheets

INTEGRATED CIRCUIT PACKAGING SYSTEM WITH ENCAPSULATED VIA AND METHOD OF MANUFACTURE THEREOF

TECHNICAL FIELD

The present invention relates generally to an integrated circuit packaging system, and more particularly to a system for an integrated circuit packaging system with a via.

BACKGROUND ART

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made using the semiconductor package structures. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Many conventional semiconductor (or "chip") packages are of the type where a semiconductor die is molded into a package with a resin, such as an epoxy molding compound. Numerous package approaches stack multiple integrated circuit dice or package in package (PIP) or a combination. Other approaches include package level stacking or package-on-package (POP). POP designs face reliability challenges and higher cost.

Thus, a need still remains for an integrated circuit packaging system providing low cost manufacturing, improved yield, low profile, and improved reliability. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a substrate; mounting an integrated circuit over the substrate; attaching a buffer interconnect to and over the substrate; forming an encapsulation over the substrate covering the buffer interconnect and the integrated circuit; and forming a via in the encapsulation and to the buffer interconnect.

The present invention provides an integrated circuit packaging system, including: a substrate; an integrated circuit over the substrate; a buffer interconnect attached to and over the substrate; a via connected to the buffer interconnect; and an encapsulation over the substrate covering the via, the buffer interconnect, and the integrated circuit, with the via exposed.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Generally, the invention can be operated in any orientation.

In addition, where multiple embodiments are disclosed and described having some features in common, for clarity and ease of illustration, description, and comprehension thereof, similar and like features one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means there is direct contact between elements. The term "processing" as used herein includes deposition of material, patterning, exposure, development, etching, cleaning, molding, and/or removal of the material or as required in forming a described structure.

Figure 1:
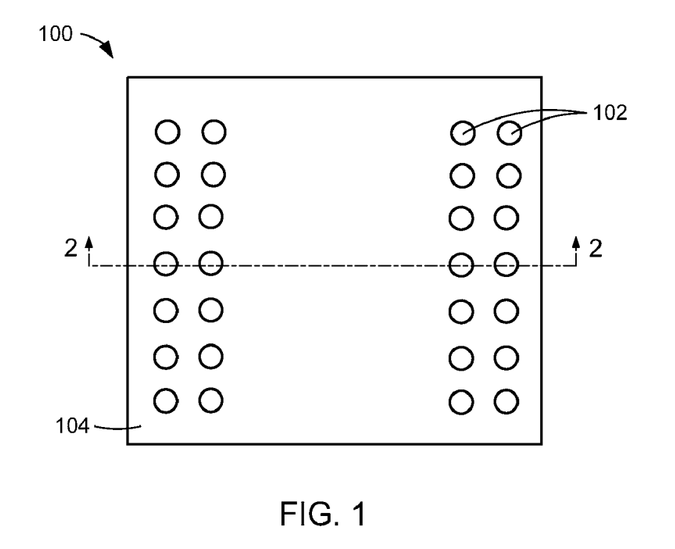
FIG. 1 is a top view of an integrated circuit packaging system in a first embodiment of the present invention.

Referring now to FIG. 1, therein is shown a top view of an integrated circuit packaging system 100 in a first embodiment of the present invention. The top view depicts vias 102, such as conductive channels or conductive plugs, along the periphery of an encapsulation 104, such as an encapsulation formed from an epoxy molding compound, a penetrable encapsulation material, or a wire in film.

For illustrative purposes, the integrated circuit packaging system 100 is shown with the vias 102 along the peripheral portion of the encapsulation 104, although it is understood that the integrated circuit packaging system 100 can have a different configuration for the vias 102. For example, the vias 102 may be placed towards or at a central portion of the encapsulation 104 or along all the sides of the integrated circuit packaging system 100.

The vias 102 can be formed in a number of different ways. For example, the vias 102 can be formed by a via formation process (not shown) such as laser-ablating or mechanical drilling followed by a gap filling process, such as solder ball pick and dropping, solder paste screen printing, or copper electroplating.

It has been found that, in order to stack integrated circuit packaging systems on top of each other, it is desirable to have vias through the encapsulation of an integrated circuit packaging system. However, it has been discovered that the via formation process leads to damage that can adversely affect the performance, yield and reliability of the integrated circuit packaging system. For example, where laser ablation is used for the via formation process, light intensity variations will often damage underlying components of the integrated circuit packaging system at the base of the vias. As a further example, where a mechanical drill is used for the via formation process, drill tip height control or substrate thickness variation will case the damage to the underlying layers.

Figure 2:
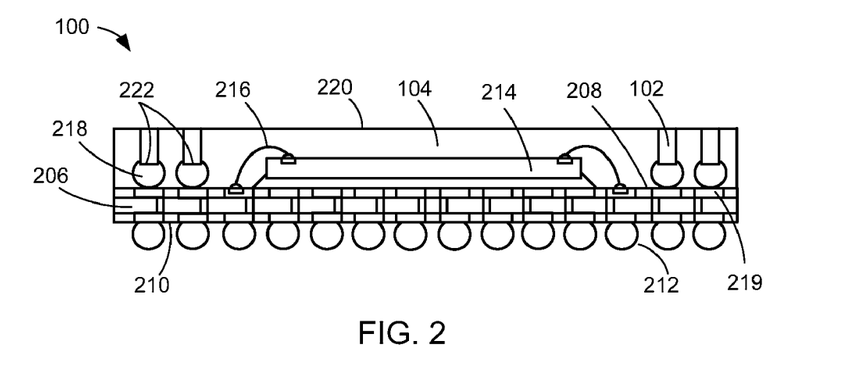
FIG. 2 is a cross-sectional view of the integrated circuit packaging system along line segment 2-2 of FIG. 1.

Referring now to FIG. 2, therein is shown a cross-sectional view of the integrated packaging system 100 along line segment 2-2 of FIG. 1. The cross-sectional view depicts a substrate 206, such as a lead frame, strip based laminate, tape, embedded die substrate, or through-silicon via. The substrate 206 can include a substrate first side 208 and a substrate second side 210. Contact pads 219 can be exposed from the substrate first side 208. External interconnects 212, such as solder balls, conductive bumps, or conductive posts, can be attached to the substrate second side 210.

An integrated circuit 214, such as an integrated circuit die, or a flip chip, can be mounted over the substrate first side 208. Internal interconnects 216, such as bond wires, ribbon bond wires, or solder balls, can connect the integrated circuit 214 and the substrate first side 208.

The integrated circuit 214 and the substrate 206 can be examples of the underlying components of the integrated circuit packaging system that can be damaged by the via formation process. For example, laser ablading or mechanical drilling can damage the contact pads 219 and disrupt electrical connectivity within the substrate 206. Mechanical drilling requires precise drill height control otherwise not only the contact pads 219 can be damaged but also cracking, warping, and other defects can result from the mechanical stress.

Buffer interconnects 218, such as solder balls, solder posts, copper posts, or conductive columns, are attached to the contact pads 219. The buffer interconnects 218 are a physical buffer that protects the substrate 206 from damage during the manufacturing process. For example, the buffer interconnects 218 prevent damage to the substrate 206 during formation of the vias 102 by functioning as a physical barrier to the substrate 206.

The encapsulation 104 can be formed over the substrate first side 208, covering the buffer interconnects 218, the internal interconnects 216, and the integrated circuit 214. The vias 102 can be formed in the encapsulation 104. The vias 102 can extend from an encapsulation top side 220 through the encapsulation 104 and connecting to the buffer interconnects 218. The vias 102 are shown as being directly attached to the buffer interconnects 218 and in a recess 222 of the buffer interconnects 218, with the recess 222 in a top portion of the buffer interconnects 218. The vias 102 are shown as having a top portion of the vias exposed from the encapsulation 104. The portion of the vias 102 exposed from the encapsulation 104 can be coplanar with the encapsulation top side 220.

For illustrative purposes, the integrated circuit packaging system 100 is shown with the buffer interconnects 218 attached to the contact pads 219, however, it is understood that the vias 102 can be connected and the buffer interconnects 218 can be attached differently. For example, the buffer interconnects 218 can be attached to and over the integrated circuit 214. In addition, the vias 102 can be formed to extend from the encapsulation top side 220, through the encapsulation 104, and connect with the buffer interconnects 218 attached to the integrated circuit 214.

It has been further discovered that providing a physical barrier or buffer at the bottom of the vias 102 will prevent damage during the via formation process and that buffer interconnects 218, such as solder balls, solder posts, copper posts, or conductive columns, can prevent damage during the via formation process. The buffer interconnects 218 provide a stable buffer which reduces manufacture sensitivity to light intensity variation in laser-ablating and drill tip height control or substrate thickness variation in mechanical drilling.

It has also been discovered that the buffer interconnect 218 also reduces process time and reduces cost by providing less via depth. The buffer interconnects 218 eliminates the need for the vias 102 to extend to the substrate 206 thereby reducing the depth of the vias 102.

Thus, the inclusion of the buffer interconnects 218 increases reliability, improve yields, and decrease costs while providing easier process control with a wider process window.

Figure 3:
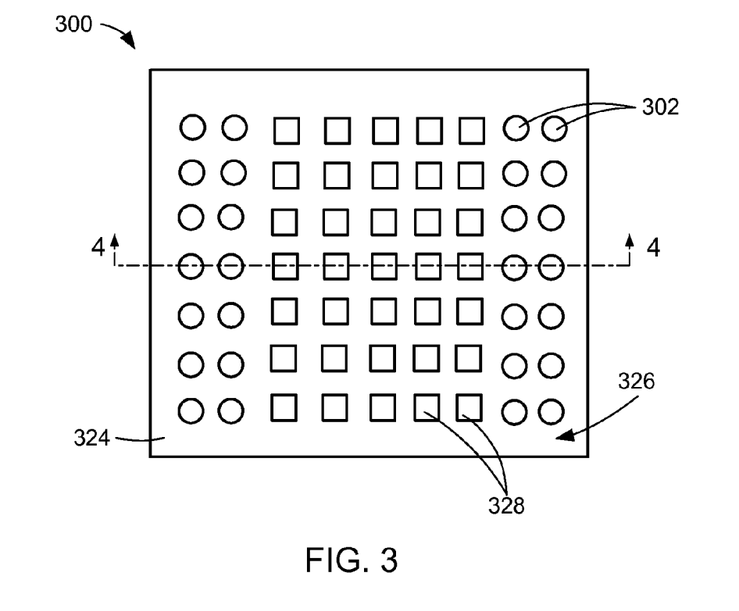
FIG. 3 is a top view of an integrated circuit packaging system in a second embodiment of the present invention.

Referring now to FIG. 3, therein is shown a top view of an integrated circuit packaging system 300 in a second embodiment of the present invention. The top view depicts an interposer 324, such as a strip or segment based laminate, a tape, or a lead frame. The interposer 324 includes an interposer first side 326. Mounting pads 328, such as contact pads or terminal pads, can be exposed from the interposer first side 326.

Vias 302, such as conductive channels or conductive plugs, can be exposed from the interposer first side 326 and can be along the periphery of the interposer first side 326. For illustrative purposes, the integrated circuit packaging system 300 is shown with the vias 302 along the peripheral portion of the interposer 324, although it is understood that the vias 302 may not be along the peripheral portion of the interposer 324. For example, the vias 302 may be placed towards or at a central portion of the interposer 324.

Also for illustrative purposes, the integrated circuit packaging system 300 is shown with the mounting pads 328 at the periphery of two sides of the interposer 324, although it is understood that the integrated circuit packaging system 300 can have a different configuration with the mounting pads 328. For example, the mounting pads 328 can also be along different peripheral portions of the interposer 324 other than along two opposing sides.

Figure 4:
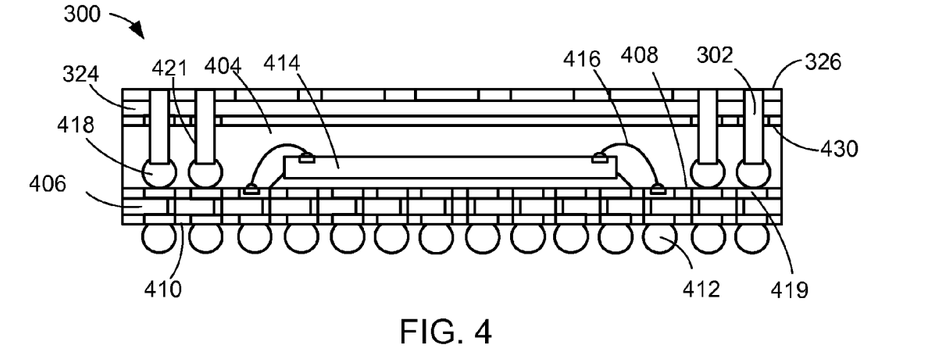
FIG. 4 is a cross-sectional view of the integrated circuit packaging system along line segment 4-4 of FIG. 3.

Referring now to FIG. 4, therein is shown a cross-sectional view of the integrated packaging system 300 along line segment 4-4 of FIG. 3. The cross-sectional view depicts a substrate 406, such as a strip based laminate, tape, embedded die substrate, or through-silicon via, with a substrate first side 408 and a substrate second side 410. External interconnects 412, such as solder balls or conductive posts, can be attached to the substrate second side 410.

An integrated circuit 414, such as an integrated circuit die or a flip chip, can be mounted over the substrate first side 408. Internal interconnects 416, such as bond wires, ribbon bond wires, or solder balls, can connect the integrated circuit 414 and the substrate first side 408.

Buffer interconnects 418, such as solder balls, solder posts, copper posts, or conductive bumps, are attached to the substrate first side 408. The buffer interconnects 418 are a physical buffer to protect the substrate 406 from damage during the manufacturing process. For example, the buffer interconnects 418 prevent damage to the substrate 406 during formation of the vias 302. The buffer interconnects 418 are attached to contact pads 419 of the substrate first side 408.

An encapsulation 404, such as an encapsulation formed from an epoxy molding compound, a penetrable encapsulation material, or a wire in film, can be formed over the substrate first side 408 covering the buffer interconnects 418, the integrated circuit 414, and the internal interconnects 416. The interposer 324 can be over encapsulation 404, the substrate first side 408, the internal interconnects 416, the buffer interconnects 418, and the integrated circuit 414. The interposer 324 can include an interposer second side 430 facing encapsulation 404.

The encapsulation 404 can be formed in a number of ways. For example, the interposer 324 can be mounted over the substrate 406 by suspending the interposer 324 over the substrate first side 408, the internal interconnects 416, the buffer interconnects 418, and the integrated circuit 414. The suspension can be achieved by holding the interposer 324 with a vacuum through a top mold chase (not shown). The encapsulation 404 can be formed by flowing or injecting the molding compound between the interposer 324 and the substrate 406. The substrate 406 can be supported by a bottom mold chase (not shown).

The vias 302 can be formed through the interposer 324 and in the encapsulation 404. The vias 302 can extend from the interposer first side 326 connecting to the buffer interconnects 418. The portion of the vias 302 exposed from the interposer first side 326 can be planar with the interposer first side 326.

For illustrative purposes, the integrated circuit packaging system 300 is shown with the buffer interconnects 418 attached to the substrate first side 408, however, it is understood that the vias 302 can be connected and the buffer interconnects 418 can be attached differently. For example, the buffer interconnects 418 can be attached to and over the integrated circuit 414. In addition, the vias 302 can be formed to extend from the interposer first side 326 and connect with the buffer interconnects 418 attached to the integrated circuit 414.

The vias 302 can be formed in a number of different ways. For example, a channel 421 can be formed through the interposer 324, in the encapsulation 404, and to the buffer interconnects 418 with a drilling process, such as laser-ablating or mechanical drilling. The vias 302 can be formed by a gap filling process, such as solder ball pick and dropping, solder paste screen printing, or copper electroplating.

It has further been discovered that the present invention provides the integrated circuit packaging system having compact interconnect scheme. The interposer can provide mounting and redistribution to the integrated circuit packaging system. The vias through the interposer provides compact connectivity from the interposer to the rest of the integrated circuit packaging system.

Figure 5:
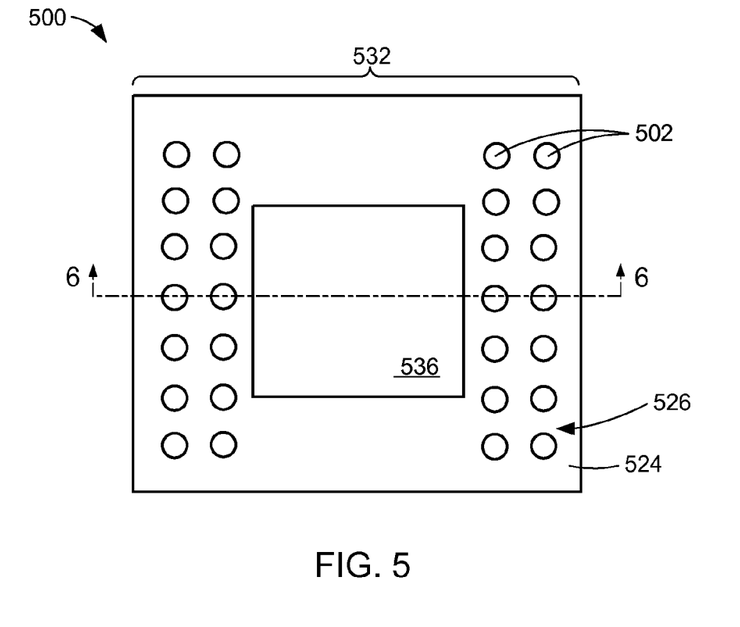
FIG. 5 is a top view of an integrated circuit packaging system in a third embodiment of the present invention.

Referring now to FIG. 5, therein is shown a top view of an integrated circuit packaging system 500 in a third embodiment of the present invention. The top view depicts an interstack module 532. The interstack module 532 can include an interposer 524, such as a strip or a segment based laminate, a tape, or a lead frame, having an interposer first side 526. The interstack module 532 can also include a packaged integrated circuit 536, such as an encapsulated integrated circuit die or an encapsulated flip chip, mounted over the interposer first side 526.

Vias 502, such as conductive channels or conductive plugs, can be exposed from the interposer first side 526 and can be along the periphery of the interposer first side 526. For illustrative purposes, the integrated circuit packaging system 500 is shown with the vias 502 along the peripheral portion of the interposer 524, although it is understood that the vias 502 may not be along the peripheral portion of the interposer 524. For example, the vias 502 may be placed towards or at a central portion of the interposer 524.

Figure 6:
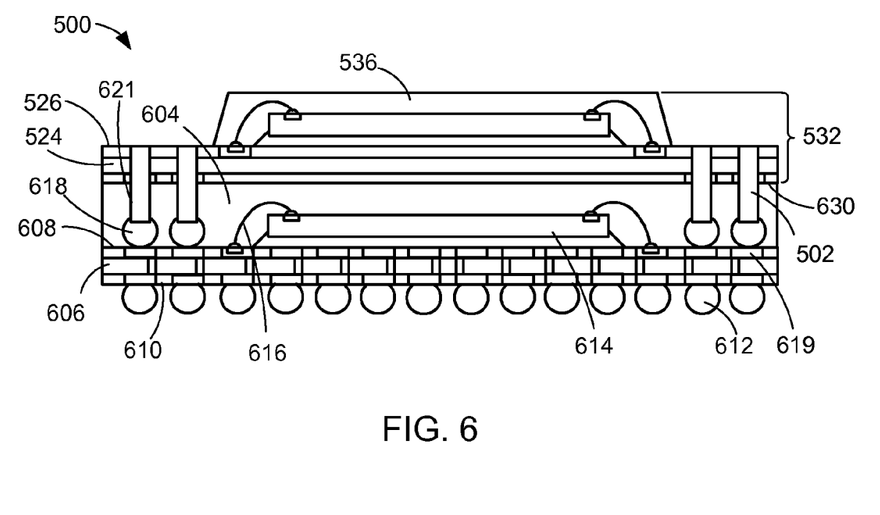
FIG. 6 is a cross-sectional view of the integrated circuit packaging system along line segment 6-6 of FIG. 5.

Referring now to FIG. 6, therein is shown a cross-sectional view of the integrated packaging system 500 along line segment 6-6 of FIG. 5. The cross-sectional view depicts a substrate 606, such as a strip based laminate, tape, embedded die substrate, or through-silicon via, with a substrate first side 608 and a substrate second side 610. External interconnects 612, such as solder balls or conductive posts, can be attached to the substrate second side 610.

An integrated circuit 614, such as an integrated circuit die or a flip chip, can be mounted over the substrate first side 608. Internal interconnects 616, such as bond wires, ribbon bond wires, or solder balls, can connect the integrated circuit 614 and the substrate first side 608.

Buffer interconnects 618, such as solder balls, solder posts, copper posts, or conductive bumps, are attached to the substrate first side 608. The buffer interconnects 618 are a physical buffer to protect the substrate 606 from damage during the manufacturing process. For example, the buffer interconnects 618 prevent damage to the substrate 606 during formation of the vias 502. The buffer interconnects 618 are attached to contact pads 619 of the substrate first side 608.

An encapsulation 604, such as an encapsulation formed from an epoxy molding compound, a penetrable encapsulation material, or a wire in film, can be formed between the substrate first side 608 and an interposer second side 630, covering the buffer interconnects 618 and the integrated circuit 614. The interposer 524 can be over the substrate first side 608, the internal interconnects 616, the buffer interconnects 618, and the integrated circuit 614.

The encapsulation 604 can be formed in a number of ways. For example, the interstack module 532 can be mounted over the substrate 606 by suspending the interstack module 532 over the substrate first side 608, the internal interconnects 616, the buffer interconnects 618, and the integrated circuit 614. The suspension can be achieved by holding the interstack module 532 with a vacuum through a top mold chase.

The encapsulation 604 can be formed by flowing or injecting the molding compound between the interstack module 532 and the substrate 606. The substrate 606 can be supported by a bottom mold chase (not shown). As a further example, the encapsulation 604 can be formed with the top mold chase without suspending or holding the interstack module 532 over the substrate 606. The interstack module 532 can be mounted over the encapsulation 604 after forming the encapsulation 604.

The vias 502 can be formed through the interposer 524 of the interstack module 532 and into the encapsulation 604. The vias 502 can extend from the interposer first side 526 and in the encapsulation 604, connecting to the buffer interconnects 618. The portion of the vias 502 exposed from the interposer first side 526 can be planar with the interposer first side 526.

For illustrative purposes, the integrated circuit packaging system 500 is shown with the buffer interconnects 618 attached to the substrate first side 608, however, it is understood that the vias 502 can be connected and the buffer interconnects 618 can be attached differently. For example, the buffer interconnects 618 can be attached to and over the integrated circuit 614. In addition, the vias 502 can be formed to extend from the interposer first side 526 and connect with the buffer interconnects 618 attached to the integrated circuit 614.

The vias 502 can be formed in a number of different ways. For example, a channel 621 can be formed through the interposer 524, in the encapsulation 604, and to the buffer interconnects 618 with a drilling process (not shown) such as laser-ablating or mechanical drilling. The vias 502 can be formed by a gap filling process (not shown), such as solder ball pick and dropping, solder paste screen printing, or copper electroplating.

Figure 7:
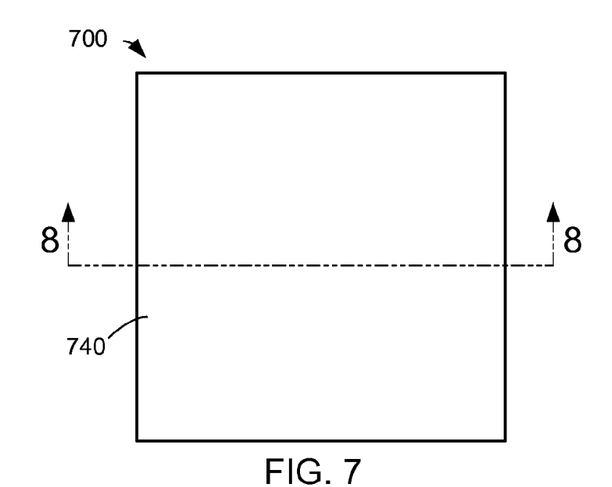
FIG. 7 is a top view of a package-on-package system in a fourth embodiment of the present invention.

Referring now to FIG. 7, therein is show a top view of a package-on-package system 700 in a fourth embodiment of the present invention. The top view depicts a mountable structure 740, such as a packaged integrated circuit, a flip-chip, a passive component, the integrated circuit packaging system 100 of FIG. 1, the integrated circuit packaging system 300 of FIG. 3, or the integrated circuit packaging system 500 of FIG. 5.

For illustrative purposes, the package-on-package system 700 is shown having a square geometric shape, although it is understood that the shape of the package-on-package system 700 may be different. For example, the package-on-package system 700 can have a rectangular shape.

Figure 8:
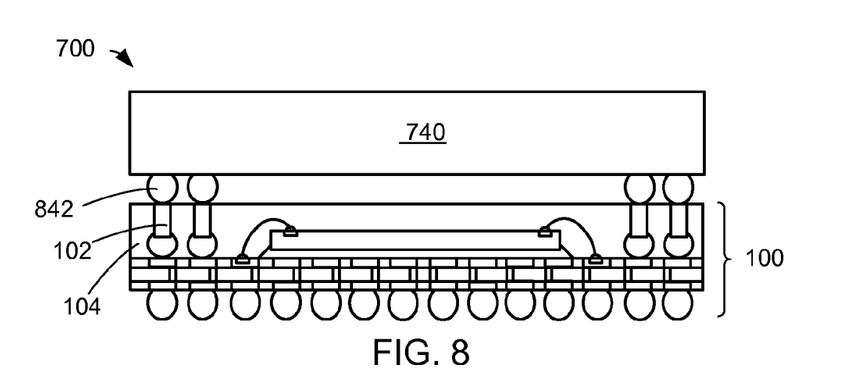
FIG. 8 is a cross-sectional view of the package-on-package system along line segment 8-8 of FIG. 7.

Referring now to FIG. 8, therein is show a cross-sectional view of the package-on-package system 700 along line 8-8 of FIG. 7. The cross-sectional view depicts the mountable structure 740 mounted over the integrated circuit packaging system 100 of FIG. 1. The mountable structure 740 can be mounted over the encapsulation 104. Mounting interconnects 842, such as a solder ball, can connect the mountable structure 740 and the vias 102.

For illustrative purposes, the package-on-package system 700 is shown with the mountable structure 740 mounted over the integrated circuit packaging system 100, although it is understood that the package-on-package system 700 can have a different configuration. For example, the mountable structure 740 can be mounted over the integrated circuit packaging system 300 of FIG. 3 or the integrated circuit packaging system 500 of FIG. 5.

Figure 9:
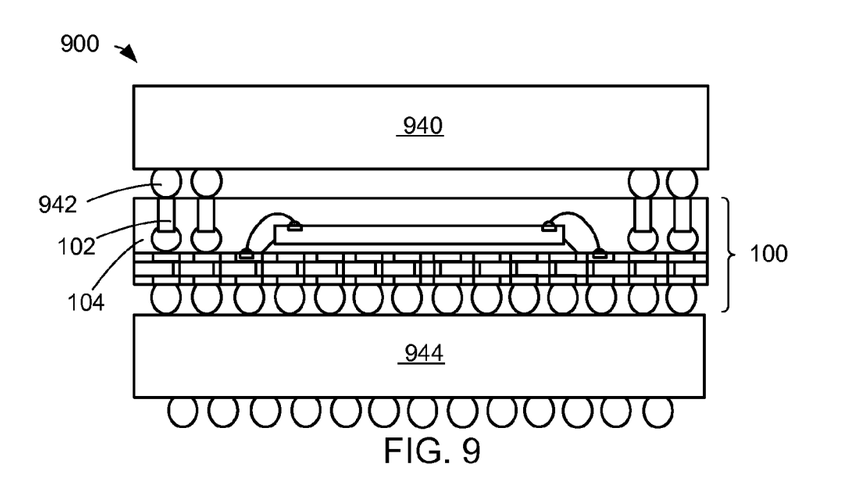
FIG. 9 is a cross-sectional view of a package-on-package system along line segment 8-8 of FIG. 7 in a fifth embodiment of the present invention.

Referring now to FIG. 9, therein is show a cross-sectional view of a package-on-package system 900 along line 8-8 of FIG. 7 in a fifth embodiment of the present invention. The cross-sectional view depicts a base structure 944, such as a fan-in package-on-package, a fan-out package-on-package, the integrated circuit packaging system 100 of FIG. 1, the integrated circuit packaging system 300 of FIG. 3, or the integrated circuit packaging system 500 of FIG. 5. The integrated circuit packaging system 100 of FIG. 1 can be mounted over the base structure 944.

A mountable structure 940, such as a packaged integrated circuit, a flip-chip, a passive component, the integrated circuit packaging system 100, the integrated circuit packaging system 300, or the integrated circuit packaging system 500, can be mounted over the integrated circuit packaging system 100. The mountable structure 940 can be mounted over the encapsulation 104. Mounting interconnects 942, can connect the mountable structure 940 and the vias 102.

For illustrative purposes, the package-on-package system 900 is shown with the integrated circuit packaging system 100 mounted over the base structure 944 and the mountable structure 940 mounted over the integrated circuit packaging system 100, although it is understood that the package-on-package system 900 can have a different configuration. For example, the integrated circuit packaging system 300 or the integrated circuit packaging system 500 can be mounted over the base structure 944 and the mountable structure 940 can be mounted over the integrated circuit packaging system 300 or the integrated circuit packaging system 500.

Figure 10:
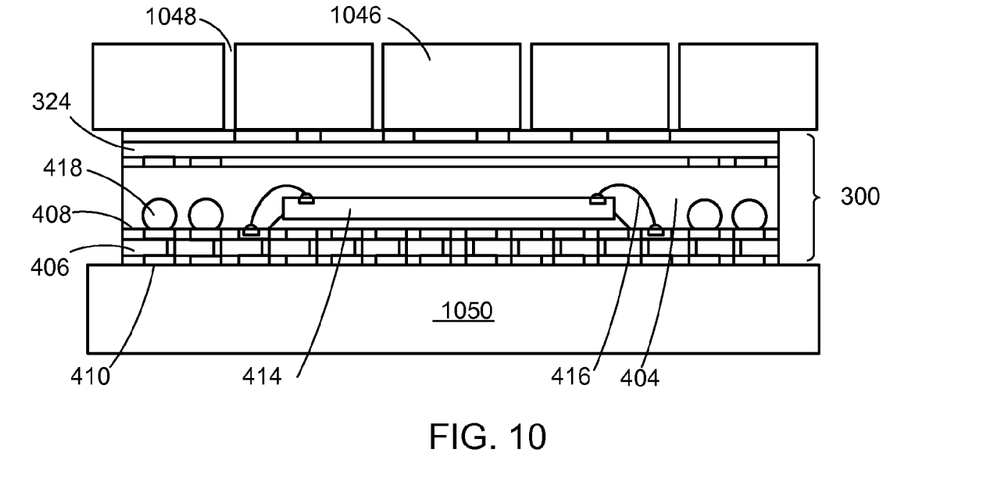
FIG. 10 is a cross-sectional view of the integrated circuit packaging system of FIG. 3 in forming the encapsulation.

Referring now to FIG. 10, therein is shown a cross-sectional view of the integrated circuit packaging system 300 of FIG. 3 in forming the encapsulation 404. The integrated circuit packaging system 300 is shown without the external interconnects 412 of FIG. 4 or the vias 302 of FIG. 4. The external interconnects 412 can be attached to the substrate second side 410 in a subsequent process.

The encapsulation 404 can be formed in a number of ways. For example, the interposer 324 can be mounted over the substrate 406 by suspending the interposer 324 over the substrate first side 408, the internal interconnects 416, the buffer interconnects 418, and the integrated circuit 414. The suspension can be achieved by holding the interposer 324 with a vacuum through a top mold chase 1046 having vacuum holes 1048. The encapsulation 404 can be formed by flowing or injecting the molding compound between the interposer 324 and the substrate 406. The substrate 406 can be supported by a bottom mold chase 1050.

As another example, the encapsulation 404 can be formed with a penetrable encapsulation material, such as a wire-in-film. The encapsulation 404 can be pre-attached to the bottom of the interposer 324. The top mold chase 1046 can hold the interposer 324 with the encapsulation 404 attached thereto. The top mold chase 1046 can press the encapsulation 404 to the substrate 406 surrounding the internal interconnects 416, the buffer interconnects 418, and the integrated circuit 414.

Figure 11:
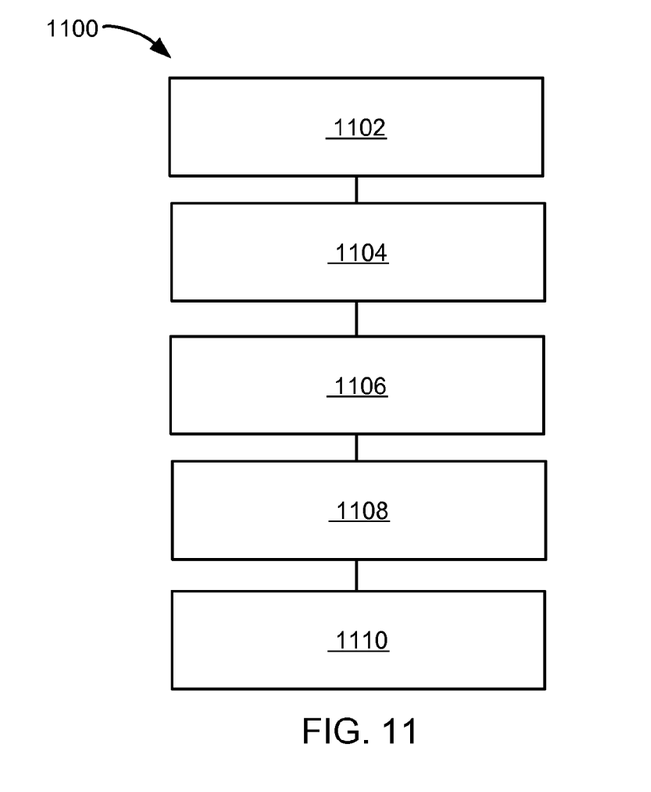
FIG. 11 is a flow chart of a method of manufacture of an integrated circuit packaging system in a further embodiment of the present invention.

Referring now to FIG. 11, therein is shown a flow chart of a method 1100 of manufacture of an integrated circuit packaging system in a further embodiment of the present invention. The method includes providing a substrate in a block 1102; mounting an integrated circuit over the substrate in a block 1104; attaching a buffer interconnect to and over the substrate in a block 1106; forming an encapsulation over the substrate covering the buffer interconnect and the integrated circuit in a block 1108; and forming a via in the encapsulation and to the buffer interconnect in block 1110.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture for forming an integrated circuit packaging system comprising:
    providing a substrate;
    mounting an integrated circuit over the substrate;
    attaching a buffer interconnect to and over the substrate;
    forming an encapsulation over the substrate covering the buffer interconnect, and the integrated circuit; and
    forming a via in the encapsulation and to a recess of the buffer interconnect.

2. The method as claimed in claim 1 further comprising:
    mounting an interposer over the encapsulation; and
    wherein:
    forming the via includes forming the via through the interposer.

3. The method as claimed in claim 1 further comprising:
    an interstack module, having an interposer, over the encapsulation; and
    wherein:
    forming the via includes forming the via through the interposer.

4. The method as claimed in claim 1 further comprising:
    attaching the buffer interconnect to and over the integrated circuit; and
    wherein forming the via includes forming the via in the encapsulation and to the buffer interconnect attached to the integrated circuit.

5. The method as claimed in claim 1 further comprising:
    providing an interposer over the substrate; and
    wherein:
    forming the encapsulation includes pre-attaching the encapsulation to the interposer; and
    forming the via includes forming the via through the interposer.

6. A method of manufacture for forming an integrated circuit packaging system comprising:
    providing an substrate having an substrate first side and an substrate second side;
    mounting an integrated circuit over the substrate first side;
    attaching a buffer interconnect along the peripheral portion of the substrate first side;
    forming an encapsulation over the substrate first side and covering the buffer interconnect and the integrated circuit; and
    forming a via through the encapsulation to a recess of the buffer interconnect with a top portion of the via coplanar with an encapsulation top side of the encapsulation.

7. The method as claimed in claim 6 further comprising mounting a mountable structure over the encapsulation with the mountable structure connected to the via.

8. The method as claimed in claim 6 further comprising:
    mounting the substrate second side over a base structure; and
    mounting a mountable structure over the encapsulation with the mountable structure connected to the via.

9. The method as claimed in claim 6 further comprising mounting an external interconnect to the substrate second side.

10. The method as claimed in claim 6 wherein mounting the integrated circuit includes mounting a flip chip.

11. An integrated circuit packaging system comprising:
    a substrate;
    an integrated circuit over the substrate;
    a buffer interconnect attached to and over the substrate;
    a via directly attached to the buffer interconnect in a recess of the buffer interconnect; and
    an encapsulation over the substrate covering the via, the buffer interconnect, and the integrated circuit, with a top portion of the via exposed.

12. The system as claimed in claim 11 further comprising:
    an interposer over the encapsulation; and
    wherein:
    the via is through the interposer.

13. The system as claimed in claim 11 further comprising:
    an interstack module, having an interposer, over the encapsulation; and
    wherein:
    the via is through the interposer.

14. The system as claimed in claim 11 wherein the buffer interconnect is attached to and over the integrated circuit.

15. The system as claimed in claim 11 wherein a top portion of the via is coplanar with an encapsulation top side of the encapsulation.

16. The system as claimed in claim 11 wherein:
    the substrate includes a substrate first side and a substrate second side;
    the buffer interconnect is attached along the peripheral portion of the substrate first side; and
    the via includes a top portion coplanar with an encapsulation top side.

17. The system as claimed in claim 16 further comprising a mountable structure mounted over the encapsulation with the mountable structure connected to the via.

18. The system as claimed in claim 16 further comprising:
    a base structure under the substrate second side; and
    a mountable structure mounted over the encapsulation with the mountable structure connected to the via.

19. The system as claimed in claim 16 further comprising an external interconnect mounted to the substrate second side.

20. The system as claimed in claim 16 wherein the integrated circuit includes a flip chip.

* * * * *